United States Patent
Ho et al.

(10) Patent No.: US 9,601,461 B2
(45) Date of Patent: Mar. 21, 2017

(54) SEMICONDUCTOR DEVICE AND METHOD OF FORMING INVERTED PYRAMID CAVITY SEMICONDUCTOR PACKAGE

(71) Applicant: Semtech Corporation, Camarillo, CA (US)

(72) Inventors: Kok Khoon Ho, San Jose, CA (US); Satyamoorthi Chinnusamy, San Jose, CA (US)

(73) Assignee: Semtech Corporation, Camarillo, CA (US)

(*) Notice: Subject to any disclaimer, the term of this patent is extended or adjusted under 35 U.S.C. 154(b) by 0 days.

(21) Appl. No.: 14/825,110

(22) Filed: Aug. 12, 2015

(65) Prior Publication Data

US 2017/0047308 A1    Feb. 16, 2017

(51) Int. Cl.
| | | |
|---|---|---|
| H01L 25/065 | (2006.01) | |
| H01L 25/00 | (2006.01) | |
| H01L 21/48 | (2006.01) | |
| H01L 21/56 | (2006.01) | |
| H01L 23/31 | (2006.01) | |
| H01L 23/367 | (2006.01) | |
| H01L 23/498 | (2006.01) | |

(52) U.S. Cl.
CPC ........ *H01L 25/0652* (2013.01); *H01L 21/486* (2013.01); *H01L 21/4882* (2013.01); *H01L 21/56* (2013.01); *H01L 23/3107* (2013.01); *H01L 23/367* (2013.01); *H01L 23/49827* (2013.01); *H01L 25/50* (2013.01); *H01L 2224/80* (2013.01)

(58) Field of Classification Search
CPC .. H01L 2224/80; H01L 25/0652; H01L 25/50
See application file for complete search history.

(56) References Cited

U.S. PATENT DOCUMENTS

| | | | |
|---|---|---|---|
| 2012/0056312 A1* | 3/2012 | Pagaila | H01L 21/561 |
| | | | 257/684 |
| 2016/0037645 A1* | 2/2016 | Lee | H05K 1/183 |
| | | | 361/761 |

* cited by examiner

*Primary Examiner* — Douglas Menz
(74) *Attorney, Agent, or Firm* — Robert D. Atkins; Patent Law Group: Atkins and Associates, P.C.

(57) ABSTRACT

A semiconductor device has a first substrate. A conductive layer is formed over the first substrate. A first cavity is formed through the first substrate and extending to the conductive layer. A first semiconductor die including a plurality of first interconnect structures is disposed in the first cavity. A second substrate is disposed over the first substrate. A second cavity is formed through second substrate. A second semiconductor die including a plurality of second interconnect structures is disposed in the second cavity. A discrete device or third semiconductor die is disposed over the second semiconductor die. A plurality of third interconnect structures is formed between the second substrate and discrete device or third semiconductor die. The first, second, and third interconnect structures are reflowed simultaneously. An encapsulant is deposited over and around the first semiconductor die, the second semiconductor die, and the discrete device or third semiconductor die.

19 Claims, 15 Drawing Sheets

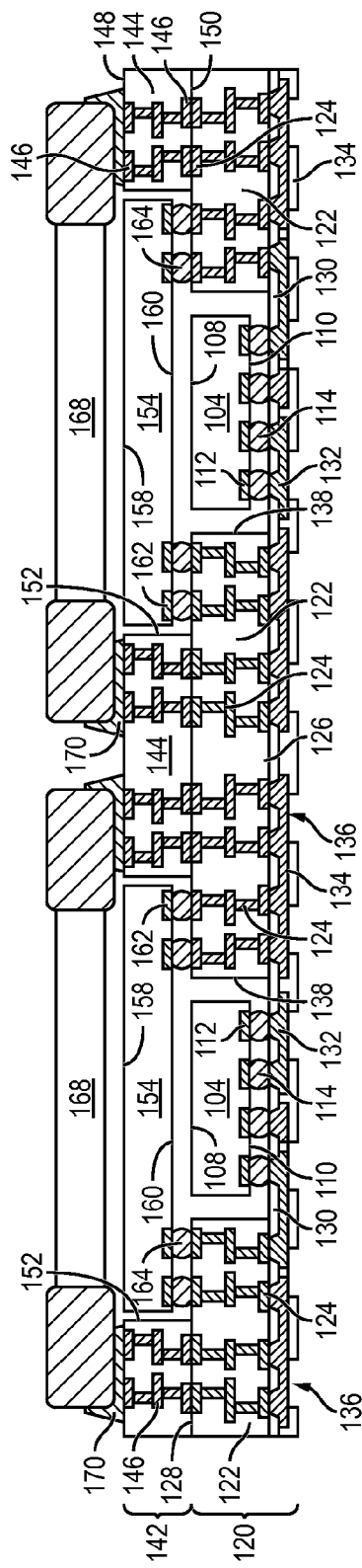

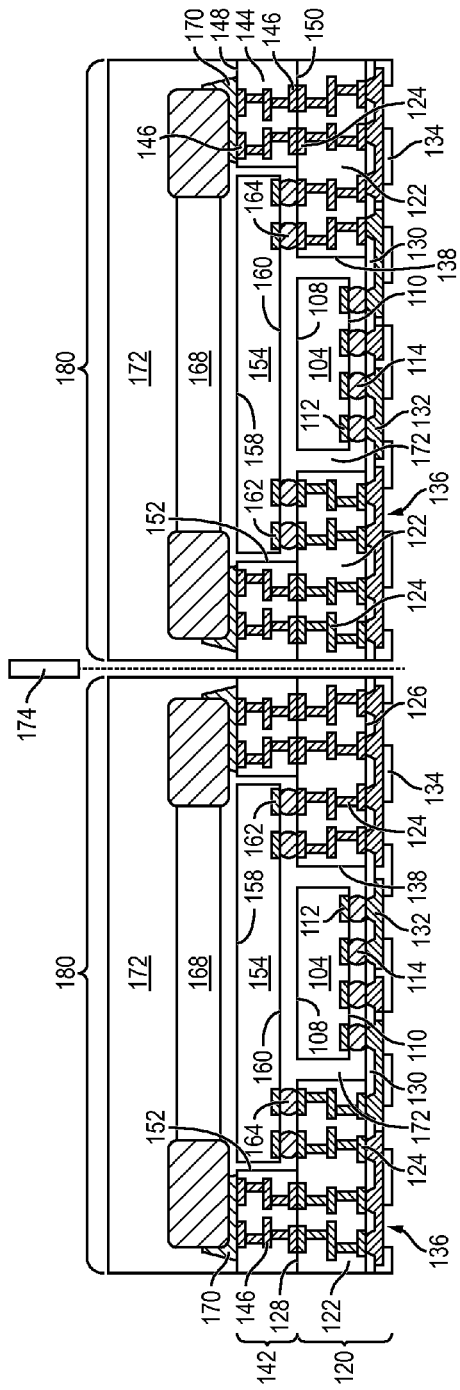
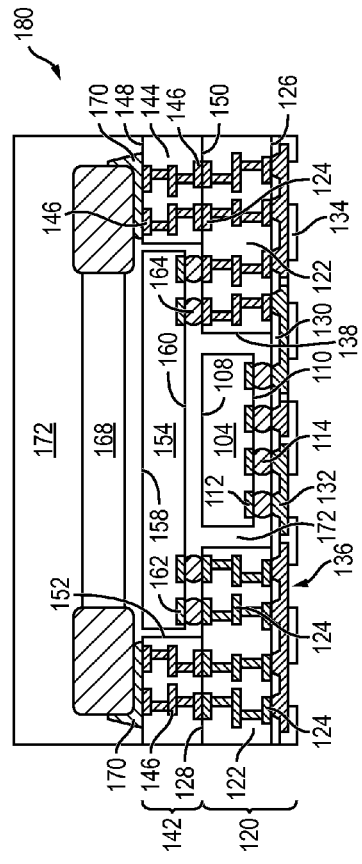
FIG. 2o
FIG. 3

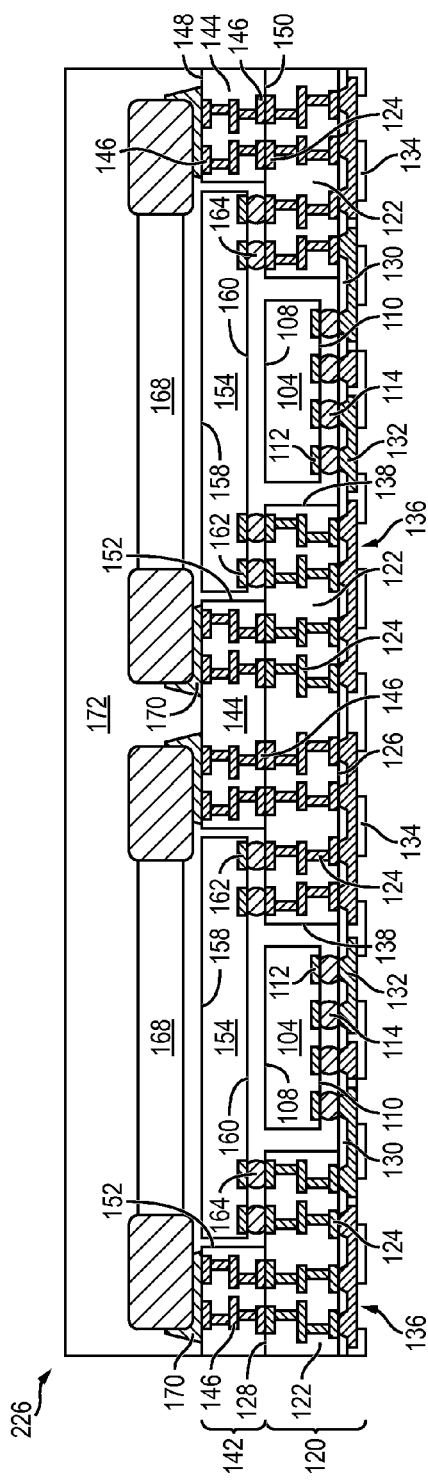
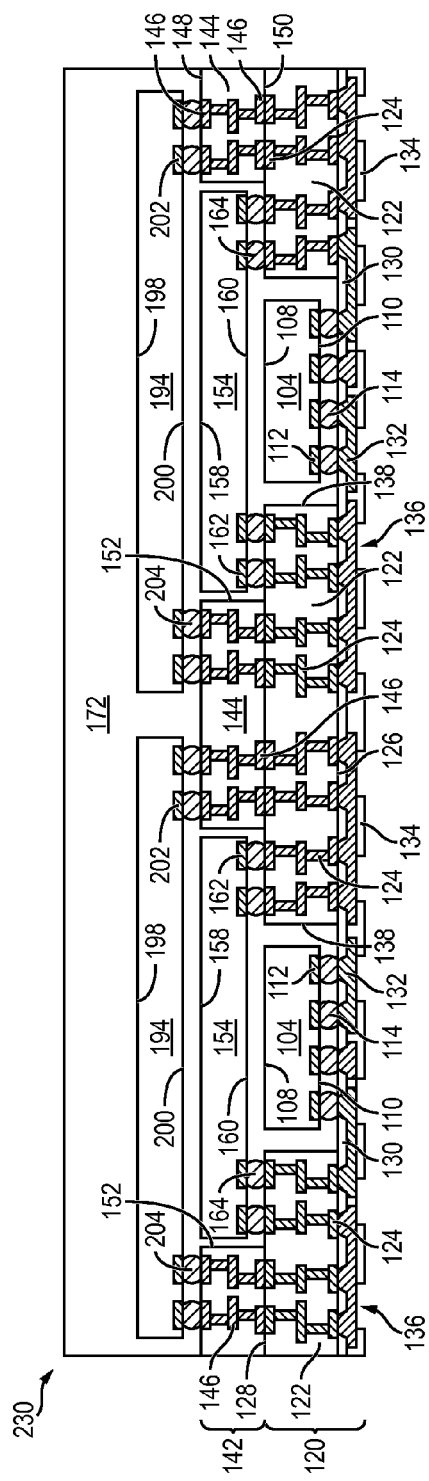
FIG. 9
FIG. 10

US 9,601,461 B2

SEMICONDUCTOR DEVICE AND METHOD OF FORMING INVERTED PYRAMID CAVITY SEMICONDUCTOR PACKAGE

FIELD OF THE INVENTION

The present invention relates in general to semiconductor devices and, more particularly, to a semiconductor device and method of forming an inverted pyramid cavity semiconductor package (IPCP).

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and are produced more efficiently. In addition, smaller semiconductor devices have a smaller footprint, which is desirable for smaller end products. A smaller semiconductor die size is achieved by improvements in the front-end process resulting in semiconductor die with smaller, higher density active and passive components. Back-end processes result in semiconductor device packages with smaller footprints by improving electrical interconnection and packaging materials. A reduced package profile is of particular importance for packaging in the cellular or smart phone industry.

One approach to achieving the objectives of greater integration and smaller semiconductor devices is to focus on three dimensional (3D) packaging technologies and the electrical interconnection between vertically stacked semiconductor die and devices. In a stacked semiconductor die package, a bottom semiconductor die is mounted to a substrate, a top semiconductor die is mounted over the bottom semiconductor die, and discrete devices are mounted over the substrate adjacent to the stacked semiconductor die. The substrate provides electrical interconnection between the components mounted over the substrate and between the components mounted over the substrate and external devices. However, mounting stacked die and other devices over the substrate increases package profile as the thickness of the substrate increases overall package thickness and mounting discrete devices adjacent to the semiconductor die increases package footprint. Further, when flipchip semiconductor die are stacked, a larger bump is required between the top semiconductor die and substrate, as the bump needs to span the thickness of the bottom semiconductor die. Larger bumps restrict interconnect pitch and reduce the input/output (I/O) count. In addition, larger bumps are susceptible to collapse which can cause electrical short and device defects.

SUMMARY OF THE INVENTION

A need exists to for a thinner semiconductor package with integration of stacked semiconductor die and other devices. Accordingly, in one embodiment, the present invention is a method of making a semiconductor device comprising the steps of providing a first substrate including a first cavity, disposing a first semiconductor die in the first cavity, disposing a second substrate including a second cavity over the first substrate, disposing a second semiconductor die in the second cavity, and depositing an encapsulant over the second semiconductor die.

In another embodiment, the present invention is a method of making a semiconductor device comprising the steps of providing a first substrate including a first cavity, disposing a first semiconductor die in the first cavity, disposing a second substrate including a second cavity over the first substrate, and disposing a second semiconductor die in the second cavity.

In another embodiment, the present invention is a semiconductor device comprising a first substrate and a first semiconductor die disposed in a first cavity of the first substrate. A second substrate is disposed over the first substrate. A second semiconductor die is disposed in a second cavity of the second semiconductor die.

In another embodiment, the present invention is a semiconductor device comprising a first substrate and a first semiconductor die disposed in a first cavity of the first substrate. A second substrate is disposed over the first substrate and includes a second cavity disposed over the first semiconductor die.

BRIEF DESCRIPTION OF THE DRAWINGS

FIG. 3 illustrates an IPCP having a discrete device disposed over semiconductor die in an inverted pyramid cavity;

FIG. 9 illustrates an IPCP having discrete devices disposed over semiconductor die in multiple inverted pyramid cavities;

FIG. 10 illustrates an IPCP having semiconductor die disposed over the semiconductor die in the inverted pyramid cavities;

DETAILED DESCRIPTION OF THE DRAWINGS

Figure 1A:
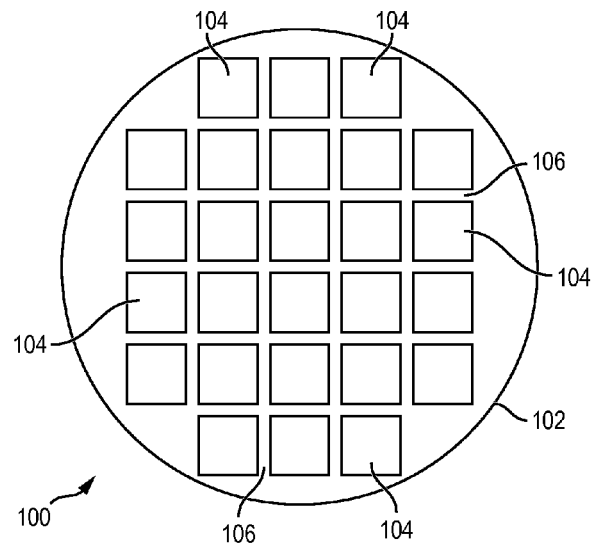
FIGS. 1a-1c illustrate a semiconductor wafer with a plurality of semiconductor die separated by a saw street.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as are included within the spirit and scope of the invention as defined by the appended claims and claim equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections are made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1a shows semiconductor wafer 100 with a base substrate material 102, such as silicon, germanium, aluminum phosphide, aluminum arsenide, gallium arsenide, gallium nitride, indium phosphide, silicon carbide, or other bulk semiconductor material for structural support. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104.

Figure 1B:
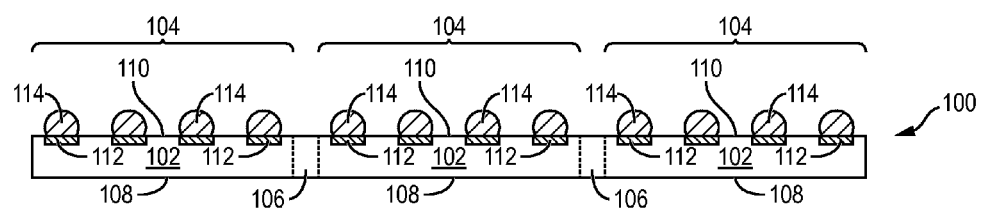

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit includes one or more transistors, diodes, and other circuit elements formed within active surface 110 to implement analog circuits or digital circuits, such as digital signal processor (DSP), ASIC, MEMS, memory, or other signal processing circuit. Semiconductor die 104 also contains integrated passive devices (IPDs), such as inductors, capacitors, and resistors, for radio frequency (RF) signal processing.

An electrically conductive layer 112 is formed over active surface 110 using PVD, CVD, electrolytic plating, electroless plating process, or other suitable metal deposition process. Conductive layer 112 includes one or more layers of aluminum (Al), copper (Cu), tin (Sn), nickel (Ni), gold (Au), silver (Ag), Palladium (Pd), SnAg, SnAgCu, CuNi, CuNiAu, CuNiPdAu, or other suitable electrically conductive material or combination thereof. Conductive layer 112 operates as contact pads electrically connected to the circuits on active surface 110. Contact pads 112 facilitate subsequent electrical interconnect between active circuits within semiconductor die 104 and external devices.

An electrically conductive bump material is deposited over contact pads 112 using an evaporation, electrolytic plating, electroless plating, ball drop, or screen printing process. The bump material is Al, Sn, Ni, Au, Ag, lead (Pb), bismuth (Bi), Cu, solder, and combinations thereof, with an optional flux solution. For example, the bump material is eutectic Sn/Pb, high-lead solder, or lead-free solder. The bump material is bonded to contact pads 112 using a suitable attachment or bonding process. The bump material is reflowed by heating the material above the material's melting point to form balls or bumps 114. In some applications, bumps 114 are reflowed a second time to improve the electrical connection with contact pads 112. Bumps 114 can also be compression bonded or thermocompression bonded to contact pads 112. Bumps 114 represent one type of interconnect structure formed over contact pads 112. The interconnect structure can also use conductive column, wire bonds, stud bump, micro bump, or other electrical interconnect.

Figure 1C:
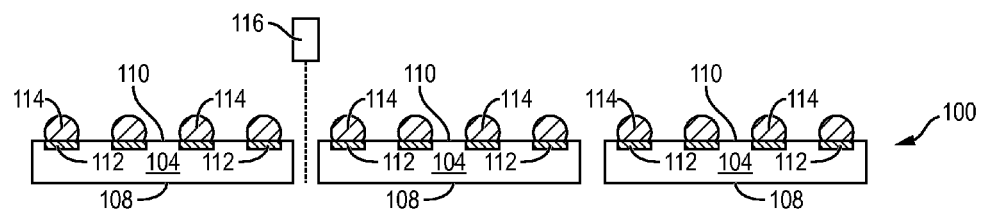

In FIG. 1c, semiconductor wafer 100 is singulated through saw street 106 using a saw blade or laser cutting tool 116 into individual semiconductor die 104. The individual semiconductor die 104 are inspected and electrically tested for identification of known good die (KGD).

Figure 2A:
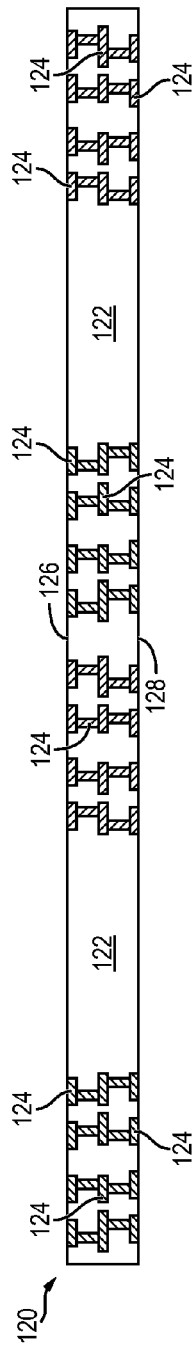
FIGS. 2a-2o illustrate a method of forming an IPCP having a discrete device disposed over semiconductor die in an inverted pyramid cavity.

FIGS. 2a-2o illustrate a method of forming an IPCP having a passive device disposed over semiconductor die in an inverted pyramid cavity. FIG. 2a shows a substrate or interposer 120 containing insulating material 122 and conductive layers 124. In one embodiment, substrate 120 contains one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Substrate 120 can also be a multi-layer flexible laminate, ceramic, copper foil, glass, or semiconductor wafer including an active surface containing one or more transistors, diodes, and other circuit elements to implement analog circuits or digital circuits.

The insulating material 122 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), polymer, solder resist, or other material having similar structural and insulating properties. Conductive layers 124 contain Al, Cu, Sn, Ni, Au, Ag, Ti, W, or other suitable electrically conductive material. Conductive layers 124 are formed using a patterning and metal deposition process such as printing, PVD, CVD, sputtering, electrolytic plating, and electroless plating. Conductive layers 124 include lateral redistribution layers (RDL) and vertical conductive vias to provide electrical interconnect through substrate 120. Portions of conductive layers 124 are electrically common or electrically isolated according to the design and function of the semiconductor die subsequently connected to substrate 120. Conductive layers 124 provide electrical interconnect between opposing surfaces 126 and 128 of substrate 120.

Figure 2B:
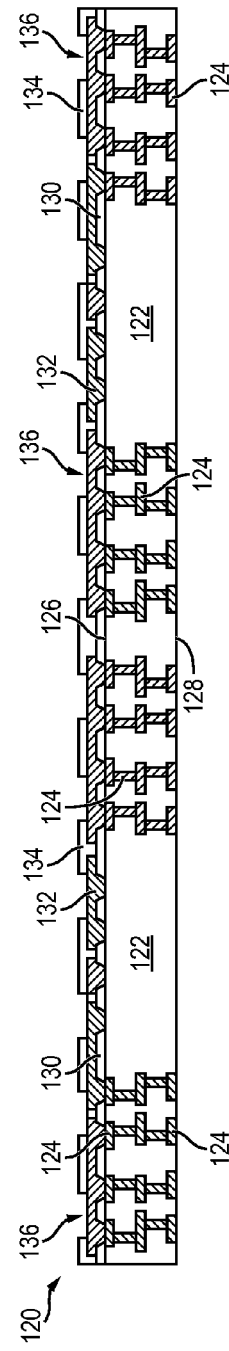

In FIG. 2b, an insulating or passivation layer 130 is formed over and across surface 126 of substrate 120 using PVD, CVD, printing, lamination, spin coating, spray coating, or other suitable application process. Insulating layer 130 contains one or more layers of SiO2, Si3N4, SiON, Ta2O5, Al2O3, HfO2, BCB, PI, PBO, polymer, or other material having similar structural and insulating properties. A portion of insulating layer 130 is removed by laser direct ablation (LDA), etching, or other suitable process to form a plurality of openings over conductive layer 124 and insulating material 122. One group of openings in insulating layer 130 extends to and exposes conductive layer 124. Another group of openings in insulating layer 130 extends to and exposes a surface of insulating material 122.

An electrically conductive layer 132 is formed over insulating layer 130 and in the openings formed over conductive layer 124 and insulating material 122. Conductive layer 132 is formed using a patterning and metal deposition process such as printing, PVD, CVD, sputtering, electrolytic plating, and electroless plating. Conductive layer 132 contains one or more layers of Al, Cu, Sn, Ni, Au, Ag, or other suitable electrically conductive material. Portions of conductive layer 132 are electrically connected to conductive layer 124. Other portions of conductive layer 132 are electrically common or electrically isolated depending on the design and function of the semiconductor package.

An insulating or passivation layer 134 is formed over conductive layer 132 and insulating layer 130 using PVD, CVD, printing, lamination, spin coating, spray coating, or other suitable application process. Insulating layer 134 contains one or more layers of SiO2, Si3N4, SiON, Ta2O5, Al2O3, HfO2, BCB, PI, PBO, polymer, solder resist, or other material having similar structural and insulating properties. A portion of insulating layer 134 is removed by LDA, etching, or other suitable process to form a plurality of openings 136 over conductive layer 132. Openings 136 expose conductive layer 132 for subsequent electrical interconnect.

Figure 2C:
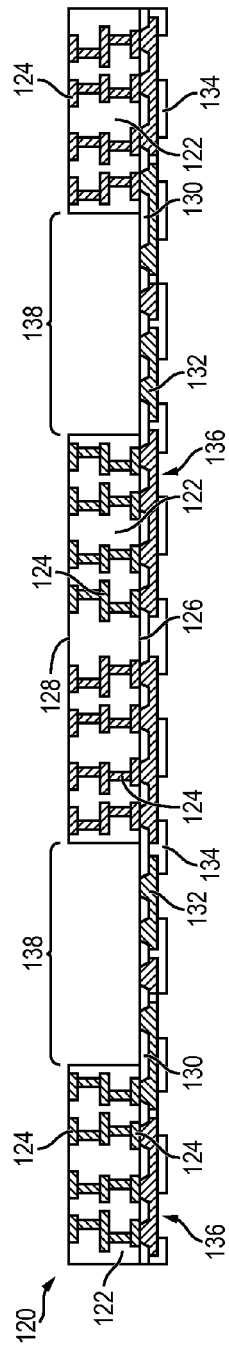

In FIG. 2c, substrate 120 is inverted and a plurality of cavities or openings 138 is formed in surface 128 of substrate 120. Cavities 138 extend completely through insulating material 122, from surface 128 of substrate 120 to surface 126. Cavities 138 extend to and expose portions of conductive layer 132. Cavities 138 form a die attach area in substrate 120.

Figure 2D:
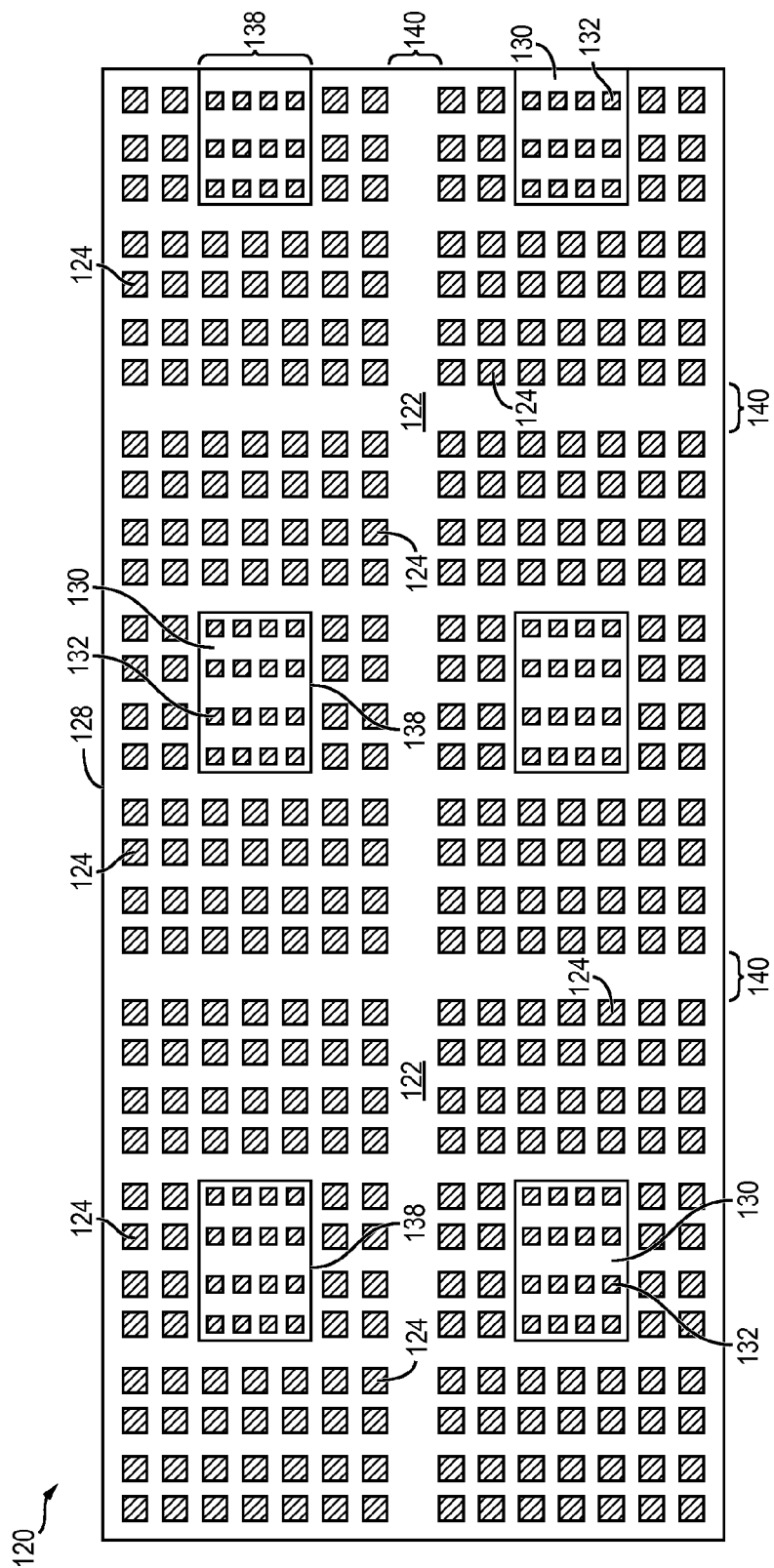

FIG. 2d shows a plan view of a portion of surface 128 of substrate 120. Conductive layer 124 forms multiple rows and columns of contact pads providing interconnection to the conductive layers formed through substrate 120. Contact pads 124 are disposed around cavities 138. Portions of conductive layer 132 and insulating layer 130 are exposed at the bottom of cavities 138. The exposed portions of conductive layer 132 provide contact pads to electrically connect to semiconductor die or other components disposed in cavity 138. A plurality of saw streets 140 are aligned with respect to cavities 138 and extend across substrate 120 such that when substrate 120 is singulated along the saw streets, a plurality of contact pads 124 are disposed around or in a peripheral region of each of the cavities 138.

Figure 2E:
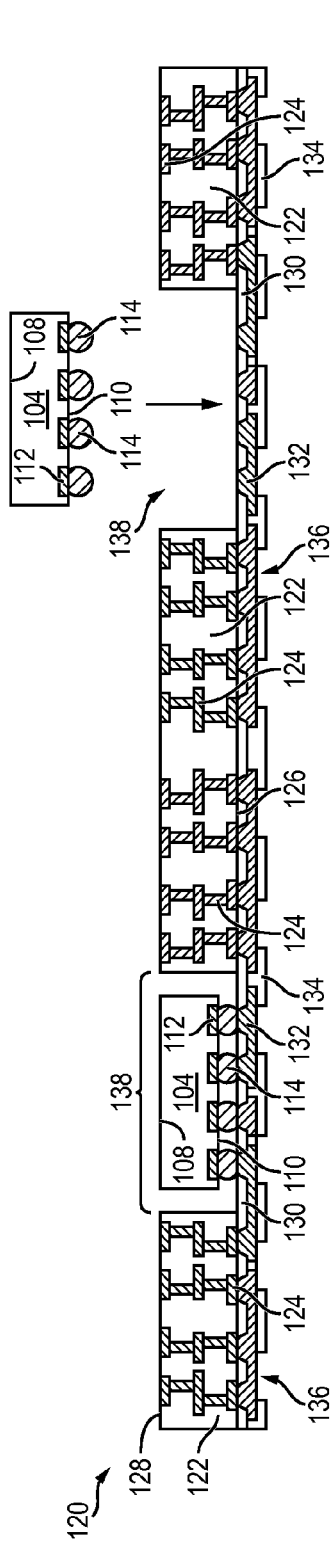

In FIG. 2e, semiconductor die 104 from FIG. 1c are disposed over substrate 120 and within cavities 138 using, for example, a pick and place operation with active surface 110 oriented toward the substrate. Bumps 114 are aligned with the exposed portions of conductive layer 132. A flux or other adhesive is disposed between semiconductor die 104 and insulating layer 130 to hold semiconductor die 104 in place. The flux is deposited on either semiconductor die 104 or in cavity 138 prior to disposing semiconductor die 104 in cavity 138.

Figure 2F:
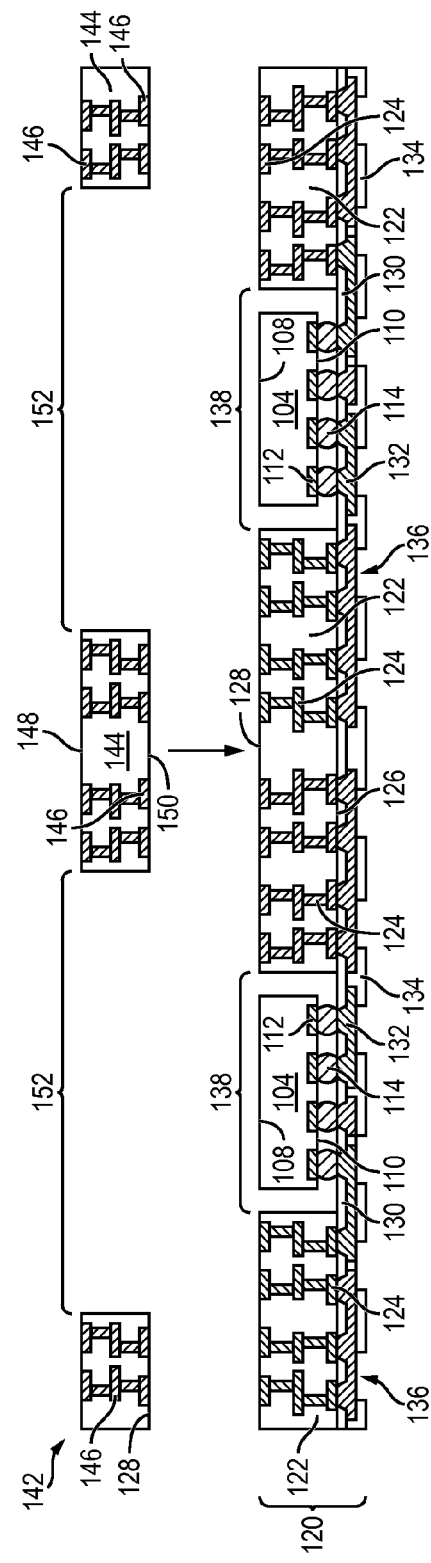

In FIG. 2f, a substrate or interposer 142 containing insulating material 144 and conductive layers 146 is disposed over substrate 120. In one embodiment, substrate 142 contains one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Substrate 142 can also be a multi-layer flexible laminate, ceramic, copper foil, glass, or semiconductor wafer including an active surface containing one or more transistors, diodes, and other circuit elements to implement analog circuits or digital circuits.

The insulating material 144 contains one or more layers of SiO2, Si3N4, SiON, Ta2O5, Al2O3, HfO2, BCB, PI, PBO, polymer, solder resist, or other material having similar structural and insulating properties. Conductive layers 146 contain Al, Cu, Sn, Ni, Au, Ag, Ti, W, or other suitable electrically conductive material. Conductive layers 146 are formed using a patterning and metal deposition process such as printing, PVD, CVD, sputtering, electrolytic plating, and electroless plating. Conductive layers 146 include lateral RDL and vertical conductive vias to provide electrical interconnect through substrate 142. Portions of conductive layers 146 are electrically common or electrically isolated according to the design and function of the semiconductor die subsequently connected to substrate 142. Conductive layers 146 provide electrical interconnect between opposing surfaces 148 and 150 of substrate 142.

A plurality of cavities or openings 152 is formed through substrate 142 using LDA, etching, or other suitable process. Cavities 152 extend completely through insulating material 144, from surface 148 of substrate 142 to surface 150.

Figure 2G:
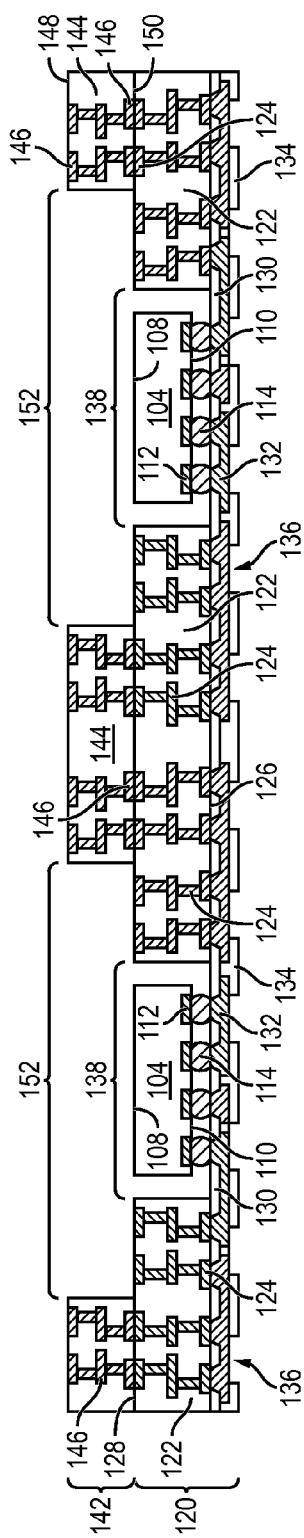

FIG. 2g shows substrate 142 disposed on surface 128 of substrate 120. Conductive layer 146 of substrate 142 electrically connects to conductive layer 124 of substrate 120. In one embodiment, a solder paste or other electrical interconnect structure is disposed between conductive layer 146 and conductive layer 124.

Cavities 152 are disposed over and aligned with cavities 138. The footprint of cavity 152 is larger than the footprint of cavity 138. Cavity 152 exposes back surface 108 of semiconductor die 104. Cavity 152 extends to surface 128 of substrate 120 and exposes the contact pads 124 on surface 128 that are proximate to cavity 138. The contact pads 124 on surface 128 that are distal to cavity 138 are covered by substrate 142 and are electrically connected to conductive layer 146 of substrate 142. The combination of cavities 138 and 152 forms an inverted pyramid shaped cavity extending from surface 148 of substrate 142 to surface 126 of substrate 120, i.e., extending from the top of cavity 152 to insulating layer 130 and conductive layer 132 at the bottom of cavity 138.

Figure 2H:
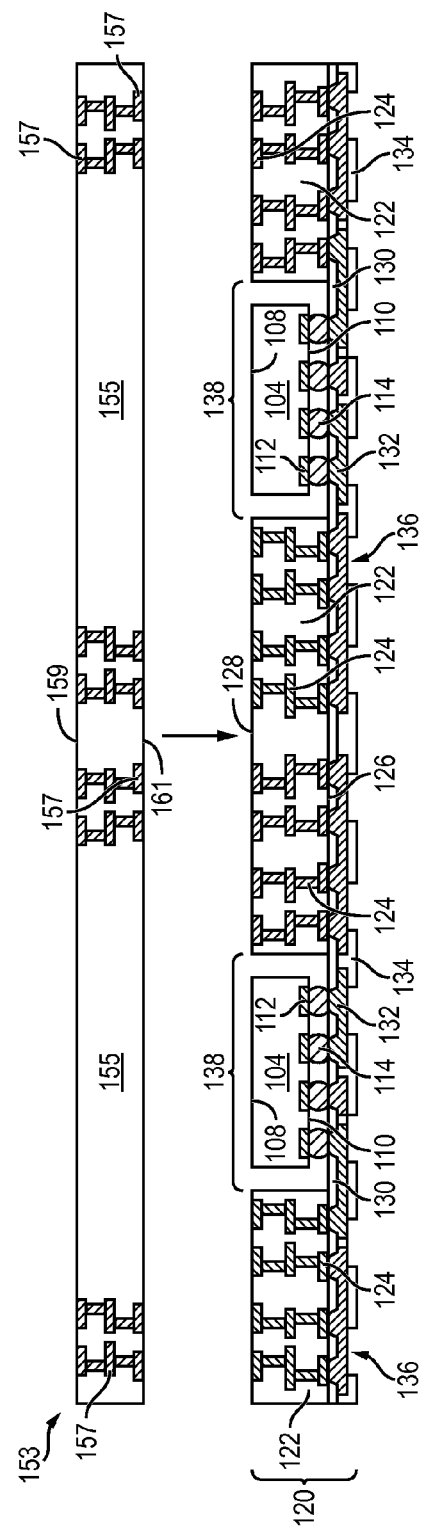
Figure 2I:
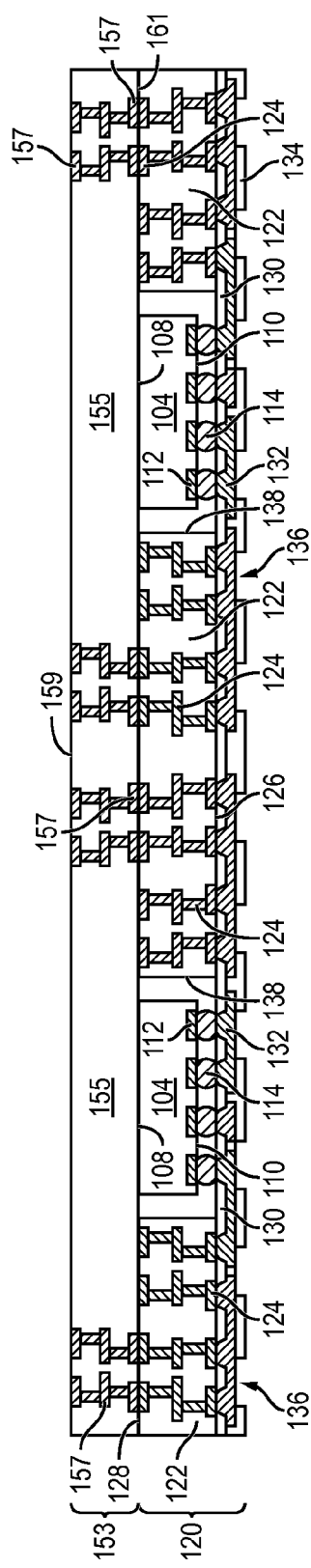
Figure 2J:
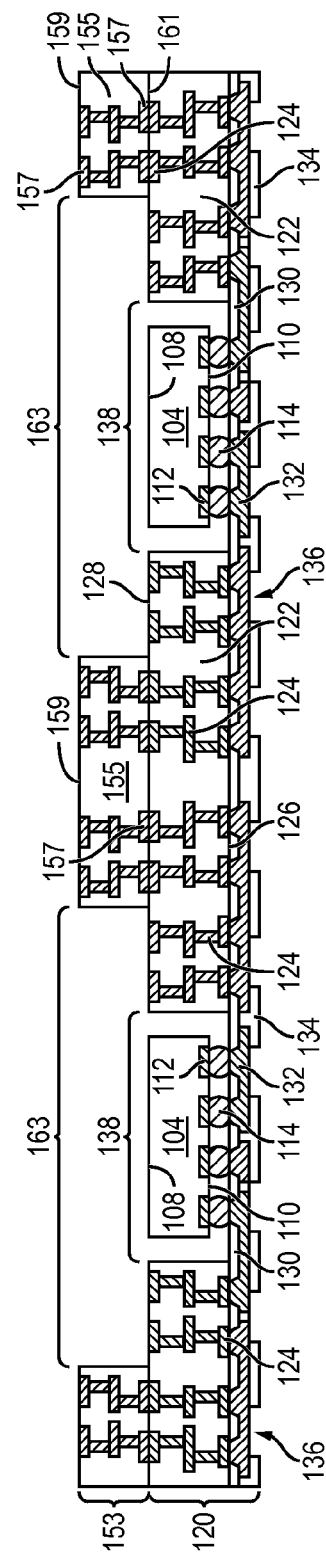

FIGS. 2h-2j illustrate an alternative method of forming an inverted pyramid cavity. Continuing from FIG. 2e, FIG. 2h shows semiconductor die 104 disposed in cavities 138. A substrate or interposer 153 containing insulating material 155 and conductive layers 157 is disposed over substrate 120. In one embodiment, substrate 153 contains one or more laminated layers of prepreg, FR-4, FR-1, CEM-1, or CEM-3 with a combination of phenolic cotton paper, epoxy, resin, woven glass, matte glass, polyester, and other reinforcement fibers or fabrics. Substrate 153 can also be a multi-layer flexible laminate, ceramic, copper foil, glass, or semiconductor wafer including an active surface containing one or more transistors, diodes, and other circuit elements to implement analog circuits or digital circuits.

The insulating material 155 contains one or more layers of SiO2, Si3N4, SiON, Ta2O5, Al2O3, HfO2, BCB, PI, PBO, polymer, solder resist, or other material having similar structural and insulating properties. Conductive layers 157 contain Al, Cu, Sn, Ni, Au, Ag, Ti, W, or other suitable electrically conductive material. Conductive layers 157 are formed using a patterning and metal deposition process such as printing, PVD, CVD, sputtering, electrolytic plating, and electroless plating. Conductive layers 157 include lateral RDL and vertical conductive vias to provide electrical interconnect through substrate 153. Portions of conductive layers 157 are electrically common or electrically isolated according to the design and function of the semiconductor die subsequently connected to substrate 153. Conductive layers 157 provide electrical interconnect between opposing surfaces 159 and 161 of substrate 153.

FIG. 2i shows substrate 153 disposed on surface 128 of substrate 120. Conductive layer 157 of substrate 153 electrically connects to conductive layer 124 of substrate 120. In one embodiment, a solder paste or other electrical interconnect structure is disposed between conductive layer 157 and conductive layer 124.

In FIG. 2j, a plurality of cavities or openings 163 is formed through surface 159 of substrate 153 using LDA, etching, or other suitable process. Cavities 163 extend completely through insulating material 155, from surface 159 of substrate 153 to surface 161. Cavities 163 are disposed over and aligned with cavities 138. The footprint of cavity 163 is larger than the footprint of cavity 138. Cavity 163 exposes back surface 108 of semiconductor die 104. Cavity 163 extends to surface 128 of substrate 120 and exposes the contact pads 124 on surface 128 that are proximate to cavity 138. The contact pads 124 on surface 128 that are distal to cavity 138 are covered by substrate 153 and are electrically connected to conductive layer 157 of substrate 153. The combination of cavities 163 and 138 forms an inverted pyramid shaped cavity extending from surface 159 of substrate 153 to surface 126 of substrate 120, i.e., extending from the top of cavity 163 to insulating layer 130 and conductive layer 132 at the bottom of cavity 138.

In one embodiment, substrate 153 is disposed over substrate 120 prior to forming of cavities 138. After disposing substrate 153 over substrate 120, cavities 138 and 163 are formed through substrates 120 and 153 using etching, LDA, or other suitable process. Semiconductor die 104 are then disposed in cavities 138.

Figure 2K:
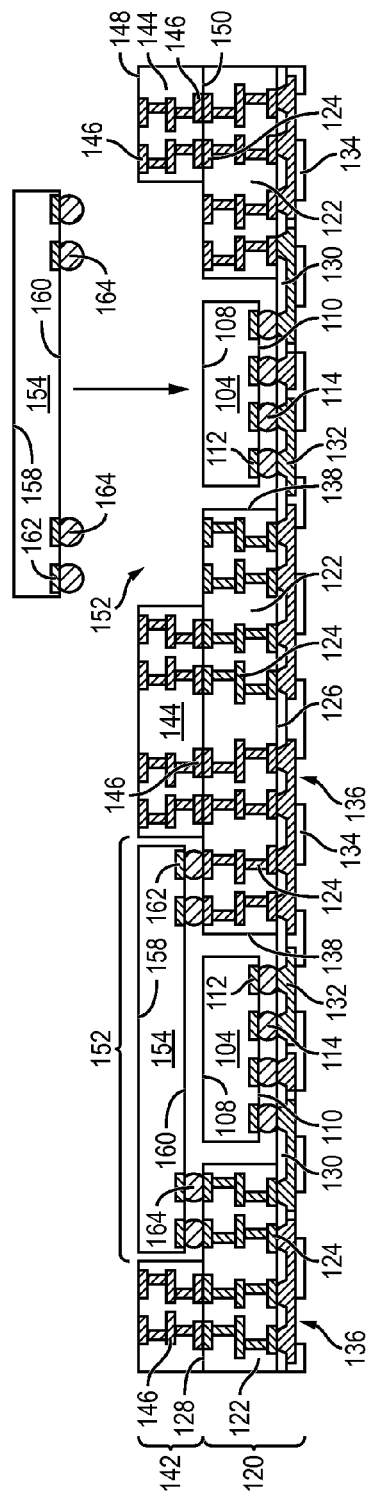

Continuing from FIG. 2g, semiconductor die or components 154 are disposed in cavities 152, as shown in FIG. 2k. Semiconductor die 154 are singulated from a wafer similar to wafer 100 in FIG. 1a. Each semiconductor die 154 has a back or non-active surface 158 and an active surface 160 containing analog or digital circuits implemented as active devices, passive devices, conductive layers, and dielectric layers formed within the die and electrically interconnected according to the electrical design and function of the die. For example, the circuit includes one or more transistors, diodes, and other circuit elements formed within active surface 160 to implement analog circuits or digital circuits, such as DSP, ASIC, MEMS, memory, or other signal processing circuit. Semiconductor die 154 also contains IPDs, such as inductors, capacitors, and resistors, for RF signal processing.

An electrically conductive layer 162 is formed over active surface 160 using PVD, CVD, electrolytic plating, electroless plating process, or other suitable metal deposition process. Conductive layer 162 includes one or more layers of Al, Cu, Sn, Ni, Au, Ag, Pd, SnAg, SnAgCu, CuNi, CuNiAu, CuNiPdAu, or other suitable electrically conductive material or combination thereof. Conductive layer 162 operates as contact pads electrically connected to the circuits on active surface 160. Contact pads 162 facilitate subsequent electrical interconnect between active circuits within semiconductor die 154 and external devices, for example, substrate 120.

An electrically conductive bump material is deposited over contact pads 162 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to contact pads 162 using a suitable attachment or bonding process. The bump material is reflowed by heating the material above the material's melting point to form balls or bumps 164. In some applications, bumps 164 are reflowed a second time to improve the electrical connection with contact pads 162. Bumps 164 can also be compression bonded or thermocompression bonded to contact pads 162. Bumps 164 represent one type of interconnect structure formed over contact pads 162. The interconnect structure can also use conductive column, wire bonds, stud bump, micro bump, or other electrical interconnect.

Figure 2L:
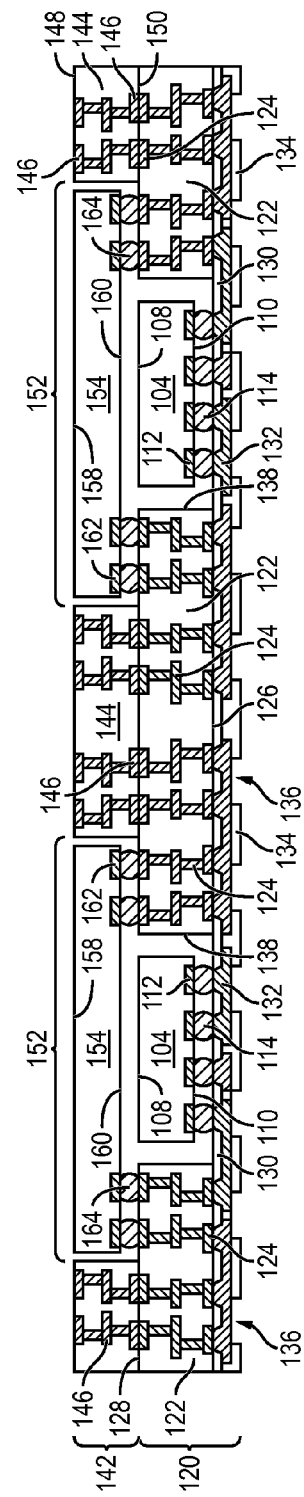

FIG. 2l shows semiconductor die 154 disposed in cavities 152. Semiconductor die 154 are disposed over semiconductor die 104. Bumps 164 align with contact pads 124 on surface 128 of substrate 120. Back surface 158 of semiconductor die 154 is coplanar with surface 148 of substrate 142. Back surface 108 of semiconductor die 104 is coplanar with surface 128 of substrate 120. A flux or other adhesive is disposed between semiconductor die 154 and surface 128 of substrate 120 to hold semiconductor die 154 in place. The flux is deposited on either semiconductor die 154 or on substrate 120 prior to disposing semiconductor die 154 in cavity 152. The flux can also be deposited between active surface 160 of semiconductor die 154 and back surface 108 of semiconductor die 104. In one embodiment, semiconductor die 104 and 154 are disposed in cavities 138 and 152, respectively, after disposing substrate 142 over substrate 120.

Stacking multiple substrates each having a cavity of increasing size forms a stepped interposer, with each substrate accounting for one step. The present embodiment shows a stack of two substrates. Any number of substrates containing cavities of increasing size can be stacked over substrate 142. For example, in one embodiment, a third substrate including a cavity larger than cavity 152 is disposed over substrate 142.

In FIG. 2m, discrete or passive devices 168 are disposed over substrate 142 and semiconductor die 154. Discrete device 168 includes filters, antenna, discrete passive devices such as inductors, resistors, or capacitors, or other devices. A solder paste 170 is formed between discrete device 168 and conductive layer 146 of substrate 142. Solder paste 170 represents one type of interconnect structure formed between discrete device 168 and conductive layer 146. The interconnect structure can also use conductive column, wire bonds, stud bump, micro bump, or other electrical interconnect.

Bumps 114, bumps 164, and solder paste 170 are reflowed simultaneously in a single reflow operation. Reflowing bumps 114, bumps 164, and solder paste 170 in a single reflow operation simplifies the manufacturing process and reduces assembly time, which minimizes cost. After reflow, bumps 114 electrically and metallurgically connect semiconductor die 104 to conductive layer 132. After reflow, bumps 164 electrically and metallurgically connect semiconductor die 154 to conductive layer 124. After reflow, solder paste 170 electrically and metallurgically connects discrete device 168 to conductive layer 146. In one embodiment, interconnect structures, e.g., bumps or solder paste, disposed between conductive layer 124 of substrate 120 and conductive layer 146 of substrate 142 are reflowed simultaneously with bumps 114, bumps 164, and solder paste 170 to electrically and metallurgically connect conductive layer 146 to conductive layer 124. After reflow, substrates 120 and 142, semiconductor die 104 and 154, and discrete devices 168 are cleaned using an ultrasonic cleaning process, spin rinse drying (SRD) process, plasma clean process, dry clean process, wet clean process, or a combination thereof. The cleaning process removes the flux used to hold semiconductor die 104 and 154 in place. After cleaning, semiconductor die 104 and 154 are held in place by the reflowed bumps.

In FIG. 2n, an encapsulant or mold underfill (MUF) material 172 is deposited over discrete devices 168, semiconductor die 104 and 154, and substrates 120 and 142 using a paste printing, compressive molding, transfer molding, liquid encapsulant molding, vacuum lamination, spin coating, mold underfill, or other suitable application process. MUF material 172 is polymer composite material, such as epoxy resin with filler, epoxy acrylate with filler, or polymer with proper filler. MUF material 172 is non-conductive and environmentally protects the semiconductor die and other components from external elements and contaminants.

MUF material 172 is disposed along the sides of semiconductor die 104 and fills the gaps between the four side surfaces of semiconductor die 104 and the sidewalls of substrate 120 created by cavity 138. MUF material 172 is disposed around bumps 114 and between active surface 110 of semiconductor die 104 and insulating layer 130. MUF material 172 covers and protects active surface 110. MUF material 172 is disposed between back surface 108 of semiconductor die 104 and active surface 160 of semiconductor die 154. MUF material 172 is disposed along the sides of semiconductor die 154 and fills the gaps between the four side surfaces of semiconductor die 154 and the sidewalls of substrate 142 created by cavity 152. MUF material 172 is disposed around bumps 164 and between active surface 160 of semiconductor die 154 and surface 128 of substrate 120. MUF material 172 covers and protects active surface 160. MUF material 172 is disposed between back surface 158 of semiconductor die 154 and discrete device 168. MUF material 172 is disposed over discrete device 168 and around the side surfaces of discrete device 168. MUF material 172 is disposed between discrete device 168 and surface 148 of substrate 142. MUF material 172 covers and protects discrete device 168.

In FIG. 2o, a saw blade or laser cutting tool 174 singulates substrates 120 and 142 into individual IPCPs 180.

FIG. 3 shows IPCP 180 after singulation. Semiconductor die 104 is electrically connected through bumps 114 to conductive layer 132. Semiconductor die 154 is electrically connected through bumps 164 and conductive layer 124 to conductive layer 132. Discrete device 168 is electrically connected through solder paste 170, conductive layer 146, and conductive layer 124 to conductive layer 132. Openings 136 in insulating layer 134 expose conductive layer 132 for connection to external devices, for example, a PCB. In one embodiment, IPCP 180 with exposed conductive layer 132 is a land grid array (LGA) package. Alternatively, interconnects structures, e.g., bumps, are formed in openings 136 over conductive layer 132 and provide interconnection between IPCP 180 and external devices. Conductive layers 132, 124, and 146 electrically connect semiconductor die 104, semiconductor die 154, and discrete device 168 of IPCP 180. Electrically connecting multiple devices, i.e., semiconductor die 104, semiconductor die 154, and discrete device 168, increases the electrical performance and overall functionality of IPCP 180.

Bumps 164 electrically connect semiconductor die 154 to contact pads 124 on surface 128 of substrate 120. Connecting semiconductor die 154 to contact pads on surface 128 allows for smaller bumps 164 and a decreased bump pitch, as bumps 164 only have to span the distance between active surface 160 and surface 128. The small size and decreased pitch of bumps 164 allows for semiconductor die 154 with increased I/O count to be incorporated into IPCP 180. Smaller bumps 164 also reduce a likelihood of bump collapse and increase the reliability of IPCP 180.

Bumps 114, bumps 164, and solder paste 170 are reflowed simultaneously in a single reflow operation. Using a single reflow operation simplifies manufacturing and reduces assembly time, which increases the throughput and minimizes the cost of IPCP 180. Conductive layers 146 provide vertical interconnection between surfaces 148 and 150 of substrate 142 and allow discrete device 168 to be disposed over semiconductor die 154. Disposing discrete device 168 directly over semiconductor die 154, as opposed to laterally offset from semiconductor die 154, decreases an overall footprint of IPCP 180.

Semiconductor die 104 is disposed within cavity 138 of substrate 120. Cavity 138 spans the thickness of substrate 120 and encompasses the thickness of semiconductor die 104 such that back surface 108 of semiconductor die 104 is coplanar with surface 128 of substrate 120. Semiconductor die 154 is disposed within cavity 152 of substrate 142. Cavity 152 spans the thickness of substrate 142 and encompasses the thickness of semiconductor die 154 such that back surface 158 of semiconductor die 154 is coplanar with surface 148 of substrate 142. The combination of cavity 152 and cavity 138 forms an inverted pyramid cavity extending through substrates 142 and 120. Disposing semiconductor die 104 and 154 within an inverted pyramid cavity that spans the thickness of substrates 120 and 142 minimizes an overall thickness of IPCP 180.

Further, forming IPCP 180 with semiconductor die 104 and 154 disposed in the inverted pyramid cavity decreases the distance between semiconductor die 104, semiconductor die 154, discrete device 168, and conductive layer 132. Decreasing the distance between the components within IPCP 180 increases the interconnection speed, reliability, functionality, and overall electrical performance of IPCP 180.

Figure 4:
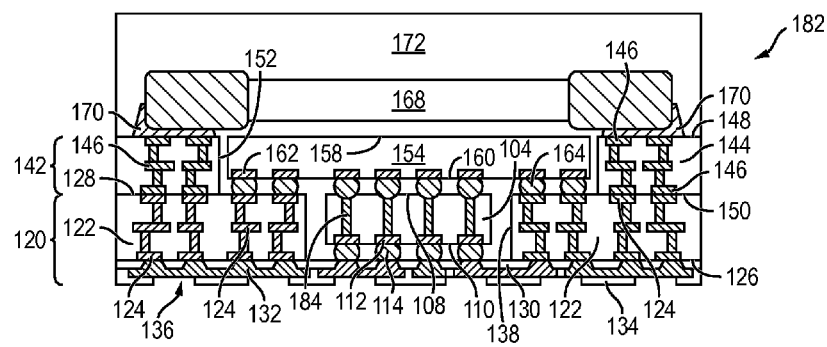
FIG. 4 illustrates an IPCP having a TSV semiconductor die.

FIG. 4 shows an IPCP 182. Semiconductor die 104 in IPCP 182 includes a plurality of through silicon vias (TSV) 184. TSV 184 are conductive vias formed through semiconductor die 104. TSV 184 provide electrical connectivity between back surface 108 of semiconductor die 104 and active surface 110. Bumps 164 of semiconductor die 154 are electrically connected to TSV 184. TSV 184 provide additional interconnection paths to and from semiconductor die 154. Semiconductor die 104 having TSV 184 allows semiconductor die 154 with increased I/O density to be incorporated into IPCP 182.

Figure 5:
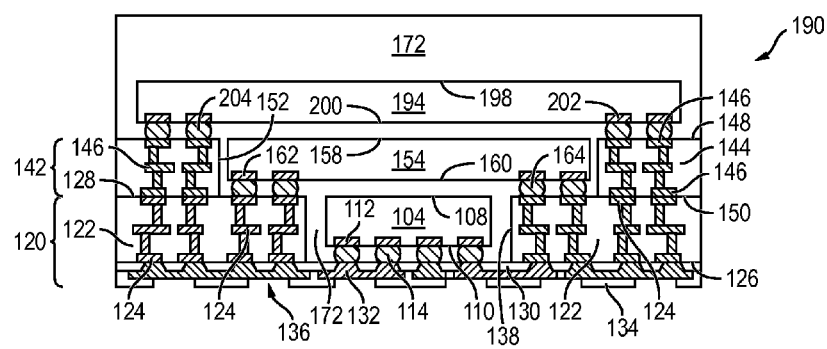
FIG. 5 illustrates an IPCP having a semiconductor die disposed over the semiconductor die in the inverted pyramid cavity.

FIG. 5 shows an IPCP 190 with a semiconductor die 194 disposed over substrate 142 and semiconductor die 154. Semiconductor die 194 is singulated from a wafer similar to wafer 100 in FIG. 1a. Semiconductor die 194 has a back or non-active surface 198 and an active surface 200 containing analog or digital circuits implemented as active devices, passive devices, conductive layers, and dielectric layers formed within the die and electrically interconnected according to the electrical design and function of the die. For example, the circuit includes one or more transistors, diodes, and other circuit elements formed within active surface 200 to implement analog circuits or digital circuits, such as DSP, ASIC, MEMS, memory, or other signal processing circuit. Semiconductor die 194 also contains IPDs, such as inductors, capacitors, and resistors, for RF signal processing.

An electrically conductive layer 202 is formed over active surface 200 using PVD, CVD, electrolytic plating, electroless plating process, or other suitable metal deposition process. Conductive layer 202 includes one or more layers of Al, Cu, Sn, Ni, Au, Ag, Pd, SnAg, SnAgCu, CuNi, CuNiAu, CuNiPdAu, or other suitable electrically conductive material or combination thereof. Conductive layer 202 operates as contact pads electrically connected to the circuits on active surface 200. Contact pads 202 facilitate subsequent electrical interconnect between active circuits within semiconductor die 194 and external devices, for example, substrate 142.

An electrically conductive bump material is deposited over contact pads 202 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to contact pads 202 using a suitable attachment or bonding process. The bump material is reflowed by heating the material above the material's melting point to form balls or bumps 204. In some applications, bumps 204 are reflowed a second time to improve the electrical connection with contact pads 202. Bumps 204 can also be compression bonded or thermocompression bonded to contact pads 202. Bumps 204 represent one type of interconnect structure formed over contact pads 202. The interconnect structure can also use conductive column, wire bonds, stud bump, micro bump, or other electrical interconnect.

MUF material 172 is deposited over semiconductor die 194 and flows around and between semiconductor die 104, 154, and 194. MUF material 172 is disposed over back surface 198 and along the four side surfaces of semiconductor die 194. MUF material 172 is disposed around bumps 204 and between active surface 200 of semiconductor die 194 and surface 148 of substrate 142 and between active surface 200 and back surface 158 of semiconductor die 154. MUF material 172 covers and protects active surface 200. In one embodiment, a portion of MUF material 172 is removed in a backgrinding operation to reduce a thickness of MUF material 172 over semiconductor die 194.

Semiconductor die 194 is electrically connected through bumps 204 to conductive layer 146, and through conductive layers 146, 124, and 132 to semiconductor die 154 and 104. Increasing the number of interconnected semiconductor die within IPCP 190 increases the electrical performance and overall functionality of IPCP 190.

Bumps 164 electrically connect semiconductor die 154 to contact pads 124 on surface 128 of substrate 120. Connecting semiconductor die 154 to contact pads 124 on surface 128 allows for smaller bumps 164 with a decreased bump pitch, as bumps 164 only have to span the distance between active surface 160 and surface 128. Bumps 204 electrically connect semiconductor die 194 to contact pads 146 on surface 148 of substrate 142. Connecting semiconductor die 194 to contact pads 146 on surface 148 allows for smaller bumps 204 with a decreased bump pitch, as bumps 204 only have to span the distance between active surface 200 and surface 148. The small size and decreased pitch of bumps 164 and 204 allows for semiconductor die with increased I/O count to be incorporated into IPCP 190. Small bumps 164 and 204 also reduce a likelihood of bump collapse and increase the reliability of IPCP 190.

Bumps 114, bumps 164, and bumps 204 are reflowed simultaneously in a single reflow operation. Using a single reflow operation simplifies manufacturing and reduces assembly time, which increases the throughput and minimizes the cost of IPCP 190. Conductive layers 146 provide vertical interconnection between surfaces 148 and 150 of substrate 142 and allow semiconductor die 194 to be disposed directly over semiconductor die 154. Disposing semiconductor die 194 over semiconductor die 154, as opposed to laterally offset from semiconductor die 154, decreases an overall footprint of IPCP 190.

Semiconductor die 104 is disposed within cavity 138 of substrate 120. Cavity 138 spans the thickness of substrate 120 and encompasses the thickness of semiconductor die 104 such that back surface 108 of semiconductor die 104 is coplanar with surface 128 of substrate 120. Semiconductor die 154 is disposed within cavity 152 of substrate 142. Cavity 152 spans the thickness of substrate 142 and encompasses the thickness of semiconductor die 154 such that back surface 158 of semiconductor die 154 is coplanar with surface 148 of substrate 142. The combination of cavity 152 and cavity 138 forms an inverted pyramid cavity extending through substrates 142 and 120. Disposing semiconductor die 104 and 154 within an inverted pyramid cavity that spans the thickness of substrates 120 and 142 minimizes an overall thickness of IPCP 190.

Further, forming IPCP 190 with semiconductor die 104 and 154 disposed in the inverted pyramid cavity decreases the distance between semiconductor die 104, semiconductor die 154, semiconductor die 194, and conductive layer 132. Decreasing the distance between the components within IPCP 190 increases the interconnection speed, reliability, functionality, and overall electrical performance of IPCP 190.

Figure 6:
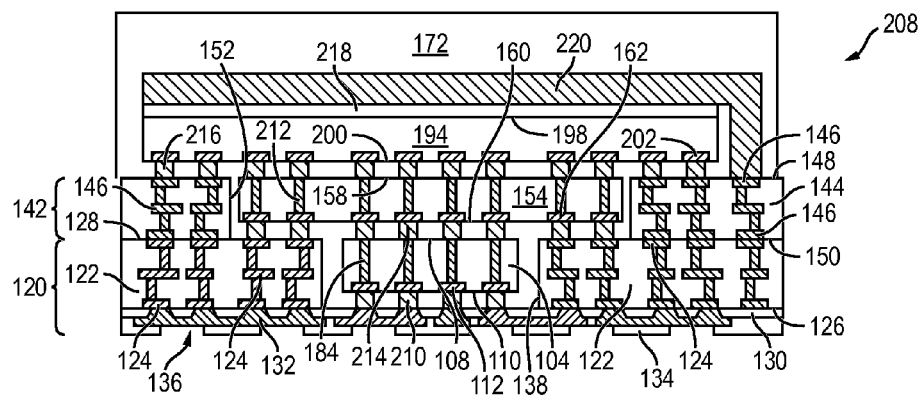
FIG. 6 illustrates an IPCP having a heat spreader and TSV semiconductor die.

FIG. 6 shows an IPCP 208 with an electrically conductive layer 220 and an adhesive, thermal interface (TIM), or insulation layer 218 disposed over the back surface 198 of semiconductor die 194. Conductive layer 220 is electrically connected to conductive layer 146 of substrate 142. In one embodiment, conductive layer 220 acts as a heat spreader to enhance heat dissipation from the semiconductor die and improve thermal performance of IPCP 208. Conductive layer 220 is Cu, Al, or other material with high thermal conductivity. In another embodiment, conductive layer 220 is connected to ground and acts as a shielding layer to block or absorb EMI, RFI, harmonic distortion, and other interference. Forming a shielding layer over semiconductor die 194, 154, and 104 improves the electrical performance of IPCP 208. In another embodiment, conductive layer 220 provides an electrically conductive path between back surface 198 of semiconductor die 194 and conductive layer 146 to increase the electrical performance and functionality of IPCP 208. Conductive layers, similar to conductive layer 220, can also be formed over back surface 158 of semiconductor die 154 and back surface 108 of semiconductor die 104.

TSV 184 are formed through semiconductor die 104 and extend from back surface 108 to active surface 110. A plurality of conductive columns 210 is formed over contact pads 112 of semiconductor die 104. Conductive columns 210 electrically connect semiconductor die 104 to conductive layer 132. A plurality of TSV 212 is formed through semiconductor die 154. TSV 212 are conductive vias that extend through semiconductor die 194 and provide electrical connectivity between back surface 158 of semiconductor die 154 and active surface 160. A plurality of conductive columns 214 is formed over contact pads 162 of semiconductor die 154. Conductive columns 214 electrically connect semiconductor die 154 to conductive layer 124 and TSV 184. A plurality of conductive columns 216 is formed over contact pads 202 of semiconductor die 194. Conductive columns 216 electrically connect semiconductor die 194 to conductive layer 146 and TSV 212.

Conductive columns 210, conductive columns 214, and conductive columns 216 are reflowed simultaneously in a single reflow operation. Using a single reflow operation simplifies manufacturing and reduces assembly time, which increases the throughput and minimizes the cost of IPCP 208. Semiconductor die 104 having TSV 184 allows semiconductor die 154 with increased I/O density to be incorporated into IPCP 208. Semiconductor die 154 having TSV 212 allows semiconductor die 194 with increased I/O density to be incorporated into IPCP 208.

Figure 7:
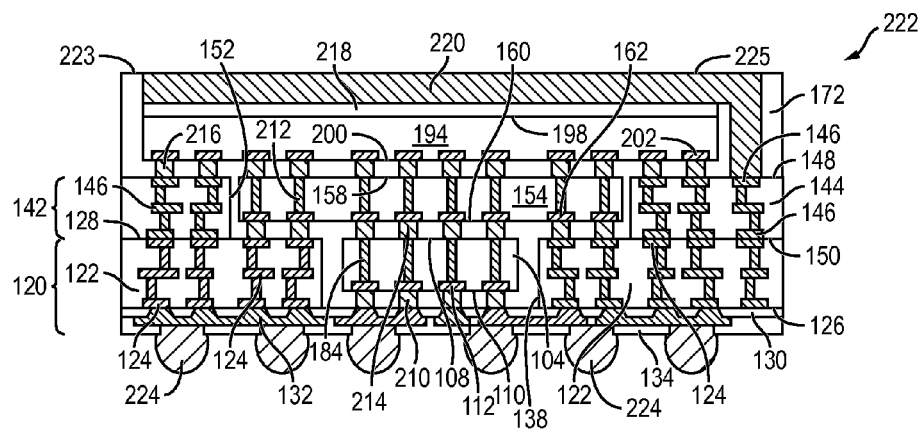
FIG. 7 illustrates an IPCP having an exposed heat spreader and TSV semiconductor die.

FIG. 7 shows an IPCP 222, similar to IPCP 208, with conductive layer 220 exposed from MUF material 172. The deposition of MUF material 172 is controlled to prevent MUF material 172 from covering surface 225 of conductive layer 220. Alternatively, a portion of MUF material 172 is removed from over conductive layer 220 using backgrinding, LDA, or other suitable process to planarize MUF material 172 and expose conductive layer 220. Surface 223 of MUF material 172 is coplanar with surface 225 of conductive layer 220.

In one embodiment, conductive layer 220 acts as a heat spreader to enhance heat dissipation from the semiconductor die and improve thermal performance of IPCP 222. Conductive layer 220 is Cu, Al, or other material with high thermal conductivity. TIM 218 is disposed between conductive layer 220 and back surface 198 of semiconductor die 194. In another embodiment, conductive layer 220 is connected to ground and acts as a shielding layer to block or absorb EMI, RFI, harmonic distortion, and other interference. Forming a shielding layer over semiconductor die 194, 154, and 104 improves the electrical performance of IPCP 222.

An electrically conductive bump material is deposited over conductive layer 132 using an evaporation, electrolytic plating, electroless plating, ball drop, or screen printing process. The bump material is Al, Sn, Ni, Au, Ag, Pb, Bi, Cu, solder, and combinations thereof, with an optional flux solution. For example, the bump material is eutectic Sn/Pb, high-lead solder, or lead-free solder. The bump material is bonded to conductive layer 132 using a suitable attachment or bonding process. The bump material is reflowed by heating the material above the material's melting point to form balls or bumps 224. In some applications, bumps 224 are reflowed a second time to improve the electrical connection with conductive layer 132. Bumps 224 can also be compression bonded or thermocompression bonded to conductive layer 132. Bumps 224 represent one type of interconnect structure formed over conductive layer 132. The interconnect structure can also use conductive column, wire bonds, stud bump, micro bump, or other electrical interconnect. Bumps 224 facilitate electrical interconnect between IPCP 222 and external devices, for example, a PCB.

Figure 8A:
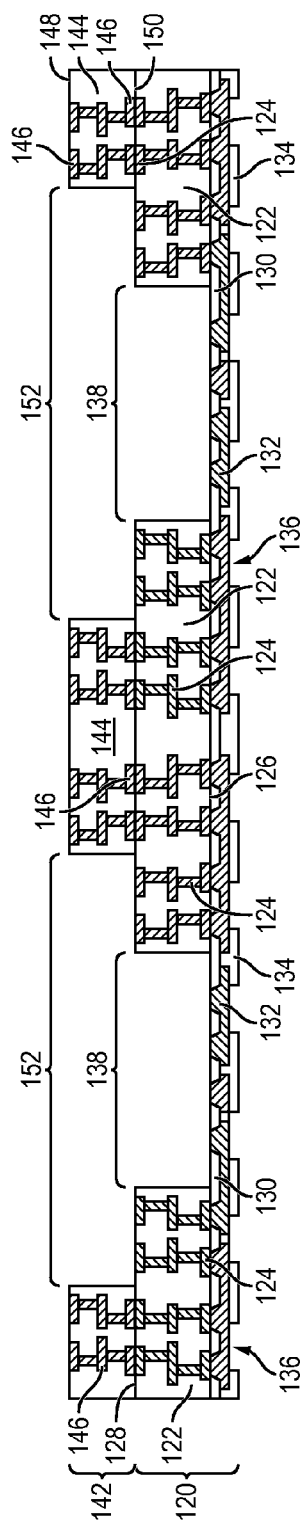
FIGS. 8a-8d illustrate a method of forming an IPCP having discrete devices disposed over semiconductor die in multiple inverted pyramid cavities.

FIGS. 8a-8d illustrate a method of forming an IPCP having discrete devices disposed over semiconductor die in multiple inverted pyramid cavities. FIG. 8a shows substrate 142 disposed over substrate 120. Cavity 152 of substrate 142 is disposed over cavity 138 of substrate 120. Portions of conductive layer 132 are exposed at the bottom of cavity 138. Cavity 152 exposes contact pads 124 on surface 128 that are proximate to cavity 138. Substrate 142 covers contact pads 124 on surface 128 that are distal to cavity 138. Conductive layer 146 electrically connects to conductive layer 124. In one embodiment, a solder paste or other interconnect structure is disposed between conductive layer 124 and conductive layer 146. The combination of cavity 138 and cavity 152 forms an inverted pyramid shaped cavity extending through substrates 120 and 142.

Figure 8B:
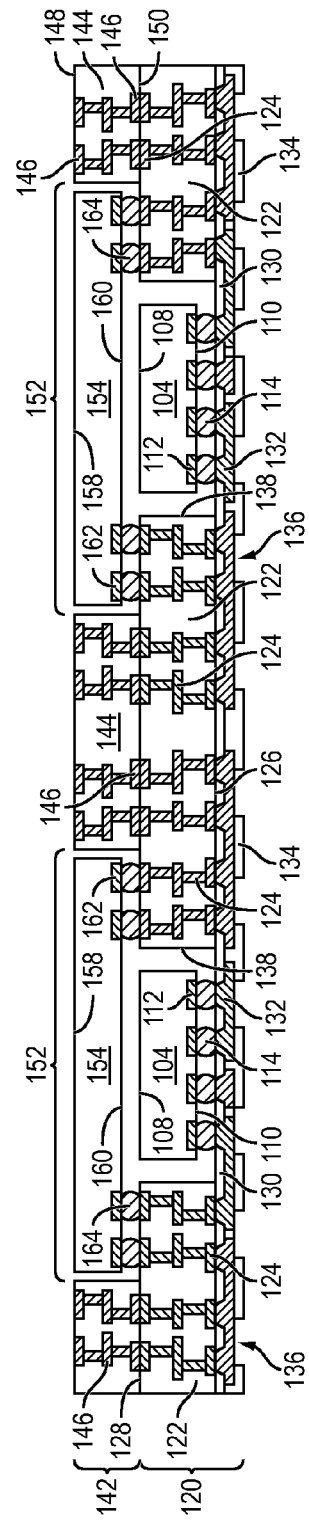

In FIG. 8b, semiconductor die 104 are disposed in cavity 138 and semiconductor die 154 are disposed over semiconductor die 104 in cavity 152. Bumps 114 are aligned with the exposed portions of conductive layer 132. Bumps 164 are aligned with the exposed contact pads 124. A flux or other adhesive is disposed between semiconductor die 104 and insulating layer 130 to hold semiconductor die 104 in place. The flux is deposited on either semiconductor die 104 or on the bottom of cavity 138 prior to disposing semiconductor die 104 in cavity 138. A flux or other adhesive is disposed between semiconductor die 154 and surface 128 of substrate 120 to hold semiconductor die 154 in place. The flux is deposited on either semiconductor die 154 or substrate 120 prior to disposing semiconductor die 154 in cavity 152. The flux can also be deposited between back surface 108 of semiconductor die 104 and active surface 160 of semiconductor die 104. In one embodiment, semiconductor die 104 is disposed in cavity 138 prior to disposing substrate 142 over substrate 120.

Figure 8C:
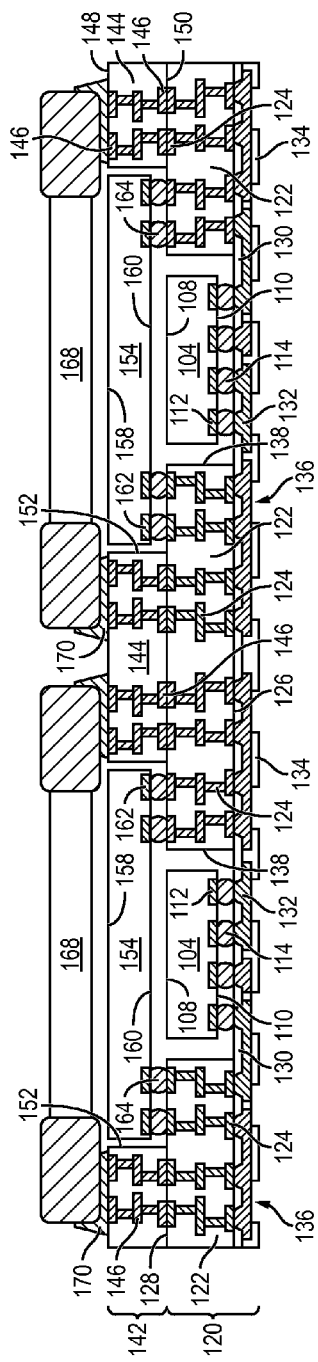

In FIG. 8c, discrete devices 168 are disposed over semiconductor die 154 and surface 148 of substrate 142. A solder paste or other electrical interconnect 170 is disposed between discrete device 168 and conductive layer 146.

Bumps 114, bumps 164, and solder paste 170 are then reflowed simultaneously in a single reflow operation. Reflowing bumps 114, bumps 164, and solder paste 170 in a single reflow operation simplifies the manufacturing processes and reduces assembly time, which minimizes cost. After reflow, bumps 114 electrically and metallurgically connect semiconductor die 104 to conductive layer 132. After reflow, bumps 164 electrically and metallurgically connect semiconductor die 154 to conductive layer 124. After reflow, solder paste 170 electrically and metallurgically connects discrete device 168 to conductive layer 146. In one embodiment, interconnect structures, e.g., solder paste, disposed between conductive layer 124 and conductive layer 146 are reflowed simultaneously with bumps 114, bumps 164, and solder paste 170 to electrically and metallurgically connect conductive layer 146 of substrate 142 to conductive layer 124 of substrate 120. After reflow, substrates 120 and 142, semiconductor die 104 and 154, and discrete devices 168 are cleaned using an ultrasonic cleaning process, SRD process, plasma clean process, dry clean process, wet clean process, or combination thereof. The cleaning process removes the flux used to hold semiconductor die 104 and 154 in place. After cleaning, semiconductor die 104 and 154 are held in place by the reflowed bumps.

Figure 8D:
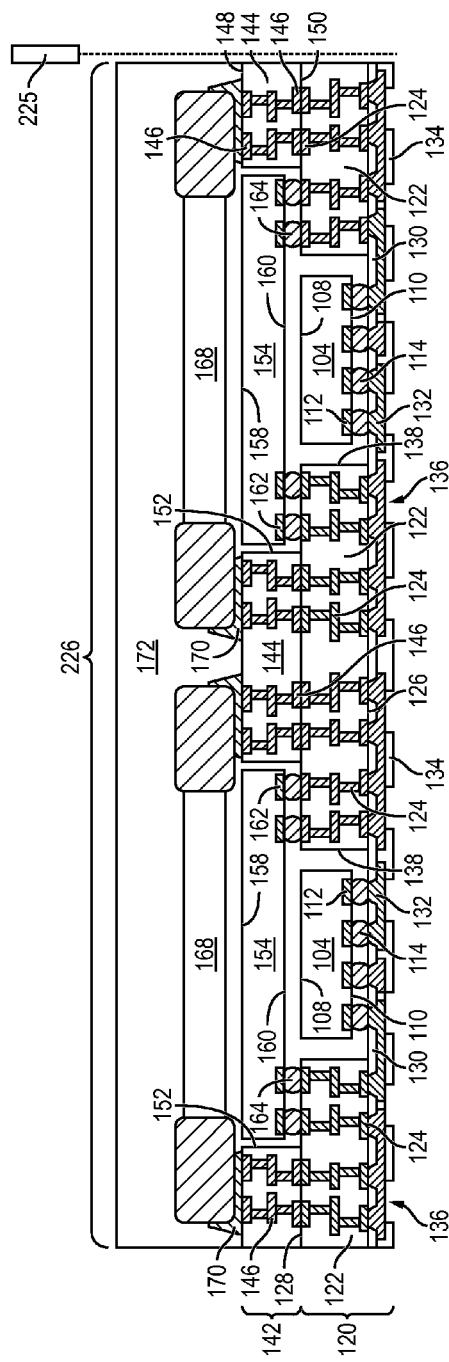

In FIG. 8d, MUF material 172 is deposited over discrete devices 168, semiconductor die 104 and 154, and substrates 120 and 142 using a paste printing, compressive molding, transfer molding, liquid encapsulant molding, vacuum lamination, spin coating, mold underfill, or other suitable application process. MUF material 172 is polymer composite material, such as epoxy resin with filler, epoxy acrylate with filler, or polymer with proper filler. MUF material 172 is non-conductive and environmentally protects the semiconductor die and other components from external elements and contaminants.

MUF material 172 is disposed along the sides of semiconductor die 104 and fills the gaps between the four side surfaces of semiconductor die 104 and the sidewalls of substrate 120 created by cavity 138. MUF material 172 is disposed around bumps 114 and between active surface 110 of semiconductor die 104 and insulating layer 130. MUF material 172 covers and protects active surface 110. MUF material 172 is disposed between back surface 108 of semiconductor die 104 and active surface 160 of semiconductor die 154. MUF material 172 is disposed along the sides of semiconductor die 154 and fills the gaps between the four side surfaces of semiconductor die 154 and the sidewalls of substrate 142 created by cavity 152. MUF material 172 is disposed around bumps 164 and between active surface 160 of semiconductor die 154 and surface 128 of substrate 120. MUF material 172 covers and protects active surface 160. MUF material 172 is disposed between back surface 158 of semiconductor die 154 and discrete device 168. MUF material 172 is disposed over discrete device 168 and around the side surfaces of discrete device 168. MUF material 172 is disposed between discrete device 168 and surface 148 of substrate 142. MUF material 172 covers and protects discrete device 168.

In FIG. 8d, a saw blade or laser cutting tool 225 singulates substrates 120 and 142 into individual IPCPs 226.

FIG. 9 shows IPCP 226 after singulation. IPCP includes multiple semiconductor die 104 disposed in substrate 120, multiple semiconductor die 154 disposed in substrate 142, and multiple discrete devices 168 disposed over substrate 142. Increasing the number of devices included in IPCP 226 increases the electrical performance and overall functionality of IPCP 226. Semiconductor die 104 are electrically connected through bumps 114 to conductive layer 132. Semiconductor die 154 are electrically connected through bumps 164 and conductive layer 124 to conductive layer 132. Discrete devices 168 are electrically connected through solder paste 170, conductive layer 146, and conductive layer 124 to conductive layer 132. Openings 136 in insulating layer 134 expose conductive layer 132 for connection to external devices, for example, a PCB. In one embodiment, IPCP 226 with exposed conductive layer 132 is a LGA package. Alternatively, interconnects structures, e.g., bumps, are formed in openings 136 over conductive layer 132 and provide interconnection between IPCP 226 and external devices. Conductive layers 132, 124, and 146 electrically connect semiconductor die 104, semiconductor die 154, and discrete devices 168 of IPCP 226.

Bumps 164 electrically connect semiconductor die 154 to contact pads 124 on surface 128 of substrate 120. Connecting semiconductor die 154 to contact pads 124 on surface 128 allows for smaller bumps 164 with a decreased bump pitch, as bumps 164 only have to span the distance between active surface 160 and surface 128. The small size and decreased pitch of bumps 164 allows for semiconductor die 154 with increased I/O count to be incorporated into IPCP 226. Small bumps 164 also reduce a likelihood of bump collapse and increase the reliability of IPCP 226.

Bumps 114, bumps 164, and solder paste 170 are reflowed simultaneously in a single reflow operation. Using a single reflow operation simplifies manufacturing and reduces assembly time, which increases the throughput and minimizes the cost of IPCP 226. Conductive layers 146 provide vertical interconnection between surfaces 148 and 150 of substrate 142 and allow discrete devices 168 to be disposed directly over semiconductor die 154. Disposing discrete devices 168 over semiconductor die 154, as opposed to laterally offset from semiconductor die 154, decreases an overall footprint of IPCP 226.

Semiconductor die 104 are disposed within cavities 138 of substrate 120. Cavities 138 span the thickness of substrate 120 and encompass the thickness of semiconductor die 104 such that back surface 108 of semiconductor die 104 is coplanar with surface 128 of substrate 120. Semiconductor die 154 are disposed within cavities 152 of substrate 142. Cavities 152 span the thickness of substrate 142 and encompass the thickness of semiconductor die 154 such that back surface 158 of semiconductor die 154 is coplanar with surface 148 of substrate 142. The combination of cavities 152 and cavities 138 forms an inverted pyramid cavity extending through substrates 142 and 120. Disposing semiconductor die 104 and 154 within inverted pyramid cavities that span the thickness of substrates 120 and 142 minimizes an overall thickness of IPCP 226.

Further, forming IPCP 226 with semiconductor die 104 and 154 disposed in the inverted pyramid cavities decreases the distance between semiconductor die 104, semiconductor die 154, discrete devices 168, and conductive layer 132. Decreasing the distance between the components within IPCP 226 increases the interconnection speed, reliability, functionality, and overall electrical performance of IPCP 226.

FIG. 10 shows an IPCP 230 with semiconductor die 194 disposed over semiconductor die 154 and surface 148 of substrate 142. Semiconductor die 194 are electrically connected through bumps 204 to conductive layer 146, and through conductive layers 146, 124, and 132 to semiconductor die 154 and 104. Semiconductor die 104, 154, and 194 are connected to conductive layer 132 for connection to external devices, for example a PCB. Increasing the number of semiconductor die within IPCP 230 increases the electrical performance and overall functionality of IPCP 230.

Bumps 164 electrically connect semiconductor die 154 to contact pads 124 on surface 128 of substrate 120. Connecting semiconductor die 154 to contact pads 124 on surface 128 allows for smaller bumps 164 with a decreased bump pitch, as bumps 164 only have to span the distance between active surface 160 and surface 128. Bumps 204 electrically connect semiconductor die 194 to contact pads 146 on surface 148 of substrate 142. Connecting semiconductor die 194 to contact pads 146 on surface 148 allows for smaller bumps 204 with a decreased bump pitch, as bumps 204 only have to span the distance between active surface 200 and surface 148. The small size and decreased pitch of bumps 164 and 204 allows for semiconductor die with increased I/O count to be incorporated into IPCP 230. Small bumps 164 and 204 also reduce a likelihood of bump collapse and increase the reliability of IPCP 230.

Bumps 114, bumps 164, and bumps 204 are reflowed simultaneously in a single reflow operation. Using a single reflow operation simplifies manufacturing and reduces assembly time, which increases the throughput and minimizes the cost of IPCP 230. Conductive layer 146 provides vertical interconnection between surfaces 148 and 150 of substrate 142 and allows semiconductor die 194 to be disposed directly over semiconductor die 154. Disposing semiconductor die 194 over semiconductor die 154, as opposed to adjacent to semiconductor die 154, decreases an overall footprint of IPCP 230.

Figure 11:
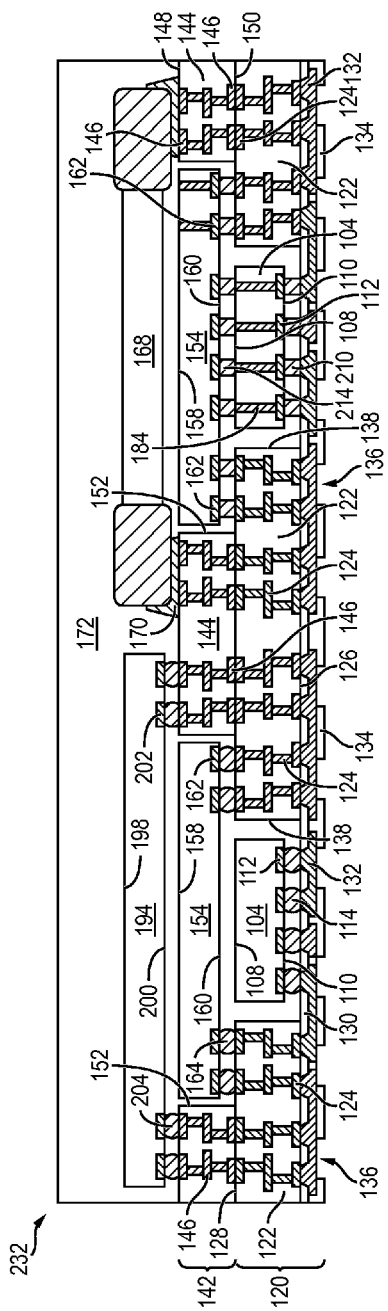
FIG. 11 illustrates an IPCP having a discrete device and semiconductor die disposed over the semiconductor die in the inverted pyramid cavities.

FIG. 11 shows an IPCP 232 with semiconductor die 194 and discrete device 168 disposed over semiconductor die 154 and surface 148 of substrate 142. Semiconductor die 194 is electrically connected through bumps 204 to conductive layer 146, and through conductive layers 146, 124, and 132 to semiconductor die 154, semiconductor die 104, and discrete device 168. Discrete device 168 is electrically connected through solder paste 170 to conductive layer 146, and through conductive layers 146, 124, and 132 to semiconductor die 154, semiconductor die 104, and semiconductor die 194. Increasing the number of interconnected semiconductor die and discrete devices within IPCP 232 increases the electrical performance and overall functionality of IPCP 232.

Bumps 164 electrically connect semiconductor die 154 to contact pads 124 on surface 128 of substrate 120. Connecting semiconductor die 154 to contact pads 124 on surface 128 allows for smaller bumps 164 with a decreased bump pitch, as bumps 164 only have to span the distance between active surface 160 and surface 128. Bumps 204 electrically connect semiconductor die 194 to contact pads 146 on surface 148 of substrate 142. Connecting semiconductor die 194 to contact pads 146 on surface 148 allows for smaller bumps 204 with a decreased bump pitch, as bumps 204 only have to span the distance between active surface 200 and surface 148. The small size and decreased pitch of bumps 164 and 204 allows for semiconductor die with increased I/O count to be incorporated into IPCP 230. Small bumps 164 and 204 also reduce a likelihood of bump collapse and increase the reliability of IPCP 230.

Bumps 114, bumps 164, solder paste 170, and bumps 204 are reflowed simultaneously in a single reflow operation. Using a single reflow operation simplifies manufacturing and reduces assembly time, which increases the throughput and minimizes the cost of IPCP 232. Conductive layers 146 provide vertical interconnection between surfaces 148 and 150 of substrate 142 and allow discrete device 168 and semiconductor die 194 to be disposed directly over semiconductor die 154. Disposing discrete device 168 and semiconductor die 194 over semiconductor die 154, as opposed to laterally offset from semiconductor die 154, decreases an overall footprint of IPCP 232.

Semiconductor die 104 are disposed within cavities 138. Cavities 138 span the thickness of substrate 120 and encompass the thickness of semiconductor die 104 such that back surface 108 of semiconductor die 104 is coplanar with surface 128 of substrate 120. Semiconductor die 154 are disposed within cavities 152. Cavities 152 span the thickness of substrate 142 and encompass the thickness of semiconductor die 154 such that back surface 158 of semiconductor die 154 is coplanar with surface 148 of substrate 142. The combination of cavities 152 and cavities 138 forms inverted pyramid cavities extending through substrates 142 and 120. Disposing semiconductor die 104 and 154 within inverted pyramid cavities that span the thickness of substrates 120 and 142 minimizes an overall thickness of IPCP 232.

Further, forming IPCP 232 with semiconductor die 104 and 154 disposed in the inverted pyramid cavities decreases the distance between semiconductor die 104, semiconductor die 154, discrete device 168, semiconductor die 194, and conductive layer 132. Decreasing the distance between the components within IPCP 232 increases the interconnection speed, reliability, functionality, and overall electrical performance of IPCP 232.

For purposes of illustration, the present embodiment shows IPCP 232 having one semiconductor die 194, one discrete device 168, one semiconductor die 104 with TSV 184 and conductive columns 210, one semiconductor die 104 with bumps 114, one semiconductor die 154 with conductive columns 214, and one semiconductor die 154 with bumps 164. Any number or combination of semiconductor die, discrete devices, semiconductor die with TSV, semiconductor die with conductive columns, semiconductor die with bumps, or heat spreaders can be included in an IPCP of the present invention.

Figure 12:
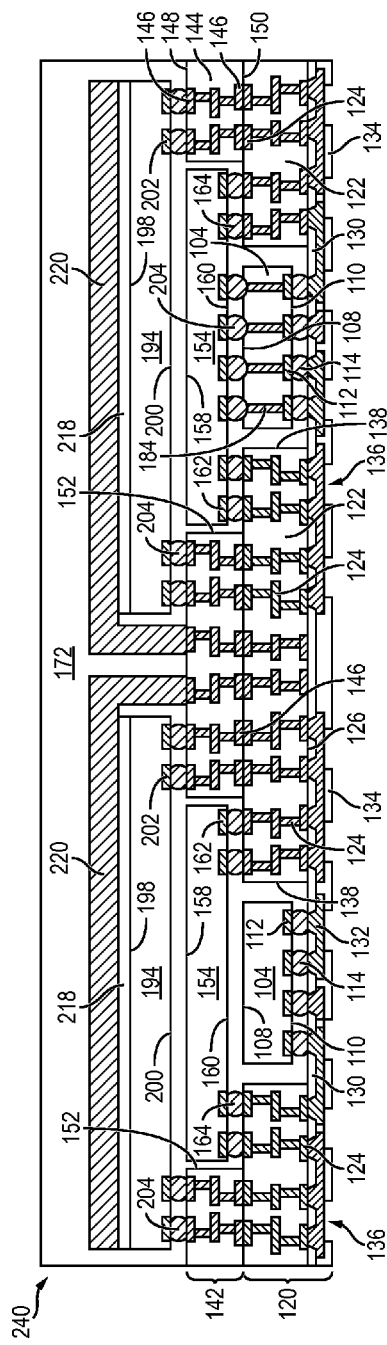
FIG. 12 illustrates an IPCP having heat spreaders disposed over the semiconductor die in the inverted pyramid cavities.

FIG. 12 shows an IPCP 240 with conductive layer 220 and an adhesive, TIM, or insulation layer 218 disposed over the back surface 198 of semiconductor die 194. Conductive layer 220 is electrically connected to conductive layer 146 of substrate 142. In one embodiment, conductive layer 220 acts as a heat spreader to enhance heat dissipation from the semiconductor die and improve thermal performance of IPCP 240. Conductive layer 220 is Cu, Al, or other material with high thermal conductivity. Conductive layer 220 can be exposed from MUF material 172 to increase the heat dissipation and thermal performance of IPCP 240. In another embodiment, conductive layer 220 is connected to ground and acts as a shielding layer to block or absorb EMI, RFI, harmonic distortion, and other interference. Forming a shielding layer over semiconductor die 194, 154, and 104 improves the electrical performance of IPCP 240. In another embodiment, conductive layer 220 provides an electrically conductive path between back surface 198 of semiconductor die 194 and conductive layer 146 to increase the electrical performance and functionality of IPCP 240.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
    providing a first substrate;
    forming an interconnect structure over the substrate;
    forming a first cavity in the first substrate over the interconnect structure;
    disposing a first semiconductor die in the first cavity on the interconnect structure;
    providing a second substrate;
    forming a second cavity through the second substrate;
    disposing the second substrate over the first substrate;
    disposing a second semiconductor die in the second cavity over the first cavity and extending outside a footprint of the first cavity; and
    depositing an encapsulant over the first semiconductor die and second semiconductor die.

2. The method of claim 1, further including disposing a discrete device over the second substrate.

3. The method of claim 1, further including disposing a third semiconductor die over the second substrate.

4. The method of claim 3, further including disposing a heat spreader over the third semiconductor die.

5. The method of claim 1, further including:
    forming a plurality of first conductive bumps over the first semiconductor die;
    forming a plurality of second conductive bumps over the second semiconductor die; and
    reflowing the first conductive bumps and second conductive bumps simultaneously with the first conductive bumps extending from the first semiconductor die to the interconnect structure and the second conductive bumps extending from the second semiconductor die to the first substrate.

6. The method of claim 1, further including forming a conductive via through the first semiconductor die.

7. A method of making a semiconductor device, comprising:
    providing a first substrate including a first conductive via;
    forming a conductive layer over a first surface of the first substrate and coupled to the first conductive via;
    forming a first cavity through the first substrate to expose the conductive layer;
    disposing a first semiconductor die in the first cavity;
    providing a second substrate including a second conductive via formed through the second substrate;
    forming a second cavity through the second substrate with the second cavity including a width larger than a width of the first cavity;
    disposing the second substrate over the first substrate with the first cavity aligned over the second cavity and the first conductive via coupled to the second conductive via and the conductive layer; and
    disposing a second semiconductor die in the second cavity and on the first substrate.

8. The method of claim 7, further including disposing a discrete device over the second semiconductor die and coupled to the first semiconductor die through the conductive layer, first conductive via, and second conductive via.

9. The method of claim 7, further including disposing a third semiconductor die over the second semiconductor die and coupled to the first semiconductor die through the conductive layer, first conductive via, and second conductive via.

10. The method of claim 9, further including disposing an encapsulant over the first semiconductor die, second semiconductor die, and third semiconductor die.

11. The method of claim 7, further including depositing an encapsulant in the first cavity and second cavity.

12. The method of claim 7, wherein the second cavity extends to a second surface of the first substrate.

13. The method of claim 7, further including:
    forming a plurality of first interconnect structures over the first semiconductor die;
    forming a plurality of second interconnect structures over the second semiconductor; and
    reflowing the first interconnect structures and second interconnect structures simultaneously.

14. A method of making a semiconductor device, comprising:
    providing a first substrate;
    forming a conductive layer over a surface of the first substrate;
    forming a first cavity completely through the first substrate to expose the conductive layer through the first cavity;
    disposing a first semiconductor die in the first cavity and electrically coupled to the conductive layer;
    disposing a second substrate including a second cavity over the first substrate with the second cavity larger than the first cavity; and
    disposing a second semiconductor die in the second cavity.

15. The method of claim 14, wherein a portion of the first substrate is exposed within the second cavity.

16. The method of claim 15, further including disposing the second semiconductor die over the portion of the first substrate exposed within the second cavity.

17. The method of claim 14, further including disposing a passive device over the second substrate and second semiconductor die.

18. The method of claim 17, further including depositing an encapsulant in the first cavity, in the second cavity, and over the passive device.

19. The method of claim 14, further including disposing a heat spreader over the second semiconductor die.

* * * * *